(12) United States Patent
Ota

(10) Patent No.: US 8,686,931 B2
(45) Date of Patent: Apr. 1, 2014

(54) LIGHT EMITTING DEVICE, ELECTRONIC APPARATUS, AND DRIVING METHOD OF LIGHT EMITTING DEVICE WITH IMAGE DISPLAYED SELECTIVELY ON TWO SIDES

(75) Inventor: Hitoshi Ota, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 362 days.

(21) Appl. No.: 13/078,341

(22) Filed: Apr. 1, 2011

(65) Prior Publication Data

US 2011/0242072 A1     Oct. 6, 2011

(30) Foreign Application Priority Data

Apr. 5, 2010  (JP) ................................. 2010-086763

(51) Int. Cl.
*G09G 3/32*     (2006.01)
(52) U.S. Cl.
USPC ............................................................ 345/82
(58) Field of Classification Search
USPC .................... 345/1.1–1.3, 76–83, 204–211
See application file for complete search history.

(56) References Cited

U.S. PATENT DOCUMENTS

| | | | |
|---|---|---|---|
| 7,453,426 B2* | 11/2008 | Yamazaki | ........................ 345/76 |
| 8,242,979 B2* | 8/2012 | Anzai et al. | ...................... 345/76 |
| 8,441,416 B2* | 5/2013 | Kang et al. | ........................ 345/76 |
| 2004/0227698 A1 | 11/2004 | Yamazaki et al. | |
| 2006/0066229 A1* | 3/2006 | Nimura | ........................... 313/506 |
| 2006/0139268 A1* | 6/2006 | Kobayashi | ........................ 345/87 |
| 2006/0267886 A1 | 11/2006 | Ozaki et al. | |
| 2007/0085847 A1* | 4/2007 | Shishido | ......................... 345/204 |
| 2010/0033510 A1 | 2/2010 | Handa et al. | |

FOREIGN PATENT DOCUMENTS

| | | |
|---|---|---|
| JP | A-2006-058893 | 3/2006 |
| JP | A-2006-330138 | 12/2006 |
| JP | A-2009-175767 | 8/2009 |
| JP | A-2010-039176 | 2/2010 |

\* cited by examiner

*Primary Examiner* — Liliana Cerullo
(74) *Attorney, Agent, or Firm* — Oliff PLC

(57) ABSTRACT

A light emitting device includes a first substrate, a second substrate, a driving circuit, a first electric supply line, and a second electric supply line. In a case where while an image is displayed on the first substrate side, an image is not displayed on the second substrate side, the value of the potential which is supplied to the second electric supply line, to be a value where voltage between both ends of the second light-emitting element falls below the light-emitting threshold voltage. In a case where while an image is not displayed on the first substrate side, an image is displayed on the second substrate side, the value of the potential which is supplied to the first electric supply line, to be a value where voltage between both ends of the first light-emitting element falls below the light-emitting threshold voltage.

4 Claims, 12 Drawing Sheets

LIGHT EMITTING DEVICE, ELECTRONIC APPARATUS, AND DRIVING METHOD OF LIGHT EMITTING DEVICE WITH IMAGE DISPLAYED SELECTIVELY ON TWO SIDES

BACKGROUND

1. Technical Field

The present invention relates to a light emitting device, an electronic apparatus, and a driving method of a light emitting device.

2. Related Art

In recent years, various light emitting devices each using a light-emitting element such as an Organic Light Emitting Diode (hereinafter referred to as an "OLED") element which is called an organic EL (Electro Luminescent) element, a light-emitting polymer element, or the like have been proposed.

For example, in JP-A-2006-58893, a light emitting device is disclosed which selectively allows only one of either a main panel (a front display) or a sub-panel (a back display) to emit light. The light emitting device disclosed in JP-A-2006-58893 includes a main scanning drive section which sequentially supplies a selection signal to a plurality of scanning lines of the main panel, a sub-scanning drive section which sequentially supplies a selection signal to a plurality of scanning lines of the sub-panel, a data driving section which supplies data voltage corresponding to an image signal to a plurality of data lines which is shared by the main panel and the sub-panel, and a driving control section which controls an operation of the light emitting device. The driving control section controls so as to allow only one of either the main scanning drive section or the sub-scanning drive section to operate while allowing the data driving section to operate.

In the light emitting device disclosed in JP-A-2006-58893, the configuration of a pixel circuit in the main panel and the configuration of a pixel circuit in the sub-panel are the same as each other and take the configuration of FIG. 18. As shown in FIG. 18, a pixel circuit is configured to include a P-channel type driving transistor DM, a light-emitting element OLED, a P-channel type switching transistor SM, and a capacitor Cst. The driving transistor DM and the light-emitting element OLED are connected in series to each other between a high potential side electric supply line, to which a high potential side power supply potential VDD is supplied, and a low potential side electric supply line, to which a low potential side power supply potential VSS is supplied. Each of the high potential side electric supply line and the low potential side electric supply line is connected in common to each pixel circuit of the main panel and the sub-panel. The capacitor Cst is provided between the gate and the source of the driving transistor DM. The switching transistor SM is provided between the gate of the driving transistor DM and a data line D and the gate thereof is connected to a scanning line S. The on/off state of the switching transistor SM is controlled in accordance with a selection signal which is output to the scanning line S.

Now, a case where while the main panel is made to emit light, the sub-panel is made to not emit light is assumed. In this case, since the selection signal is not output to the scanning line S corresponding to the pixel circuit of the sub-panel, the switching transistor SM of the pixel circuit of the sub-panel is maintained in an OFF state. Therefore, a data voltage which is output to the data line D is not supplied to the gate of the driving transistor DM of the pixel circuit of the sub-panel. Here, since the data voltage written at the time of previous light-emitting of the pixel circuit is held in the capacitor Cst of the pixel circuit of the sub-panel, the driving transistor DM becomes an electrically conductive state. Since a high potential side power supply line and a low potential side power supply line are connected in common to each pixel circuit of the main panel and the sub-panel and the voltage between the high potential side power supply line and the low potential side power supply line is set to be a value which exceeds the light-emitting threshold voltage of the light-emitting element OLED, an electric current according to the data voltage held in the capacitor Cst flows in the light-emitting element of the pixel circuit of the sub-panel. Therefore, a problem arises that it is difficult to reliably make the panel (in this case, the sub-panel) of the side which should be made to not emit light be in a non-luminescent state and also power is wasted. This problem also arises similarly in a case where while the sub-panel is made to emit light, the main panel is made to not emit light.

Also, an aspect which makes the sub-panel be in a non-luminescent state by writing non-luminescence data into the pixel circuit of the sub-panel side, thereby making the capacitor Cst hold a non-luminescence voltage, can be assumed. However, in this case, the voltage of the capacitor Cst varies from the non-luminescence data voltage due to a leakage current of the switching transistor SM, so that a problem where it is difficult to reliably maintain a non-luminescent state is still not resolved.

SUMMARY

An advantage of some aspects of the invention is that in a light emitting device which selectively allows only one of either a face of one side or a face of the other side of a panel to emit light, it reduces power consumption while reliably making a face of the side which should be made to not emit light be in a non-luminescent state.

According to a first aspect of the invention, there is provided a light emitting device including: a pixel circuit disposed on a substrate; and a driving circuit which drives the pixel circuit, wherein the pixel circuit includes a first circuit provided corresponding to a first electric supply line, and a second circuit provided corresponding to a second electric supply line, the first circuit includes a first light-emitting element which includes a first electrode (a first pixel electrode 61) electrically connected to the first electric supply line and a second electrode (an opposite electrode 90) which faces the first electrode, a first driving transistor electrically connected to the first electrode, a first capacitive element for holding the potential of the gate of the first driving transistor, and a first switching element which is provided between the gate of the first driving transistor and a data line, wherein emitted light of the first light-emitting element is extracted from one face side of the substrate, the second circuit includes a second light-emitting element which includes a third electrode (a second pixel electrode 62) electrically connected to the second electric supply line and the second electrode which faces the third electrode, a second driving transistor electrically connected to the third electrode, a second capacitive element for holding the potential of the gate of the second driving transistor, and a second switching element which is provided between the gate of the second driving transistor and the data line, wherein emitted light of the second light-emitting element is extracted from the other face side of the substrate, and in a case where while an image is displayed on one face side of the substrate by the first circuit, an image is not displayed on the other face side of the substrate, the driving circuit outputs a data potential according to image data to the data line, sets the potential of the first electric supply line to be a value where voltage between the first electrode and the second electrode of the first light-emitting element exceeds the light-emitting threshold voltage of the first light-emitting element, and sets the potential of the second electric supply line to be a value where voltage between the third electrode and the second electrode of the second light-emitting element falls below the light-emitting threshold voltage of the second light-emitting element, and in a case where while an image is not displayed on one face side of the substrate, an image is displayed on the other face side of the substrate by the second circuit, the driving circuit outputs the data potential to the data line, sets the potential of the first electric supply line to be a value where voltage between the first electrode and the second electrode of the first light-emitting element falls below the light-emitting threshold voltage of the first light-emitting element, and sets the potential of the second electric supply line to be a value where voltage between the third electrode and the second electrode of the second light-emitting element exceeds the light-emitting threshold voltage of the second light-emitting element.

In the above aspect of the invention, a power supply voltage is supplied from a separate power supply line to each of the first circuit for generating an image which is displayed on one face side of the substrate and the second circuit for generating an image which is displayed on the other face side of the substrate. In a case where while an image is displayed on one face side of the substrate by the first circuit, an image is not displayed on the other face side of the substrate, since the driving circuit sets the potential of the second electric supply line to be a value where the voltage between the third electrode and the second electrode of the second light-emitting element falls below the light-emitting threshold voltage of the second light-emitting element, an electric current does not flow in the second light-emitting element. Therefore, it is possible to reliably make the other face side of the substrate a non-luminescent state and also power consumption can be reduced compared to an aspect in which a power supply voltage which exceeds the light-emitting threshold voltage of each of the first light-emitting element and the second light-emitting element is supplied in common to the first circuit and the second circuit.

Also, in a case where while an image is not displayed on one face side of the substrate, an image is displayed on the other face side of the substrate by the second circuit, since the driving circuit sets the potential of the first electric supply line to be a value where the voltage between the first electrode and the second electrode of the first light-emitting element falls below the light-emitting threshold voltage of the first light-emitting element, an electric current does not flow in the first light-emitting element. Therefore, it is possible to reliably make one face side of the substrate be in a non-luminescent state and also power consumption can be reduced compared to an aspect in which a power supply voltage which exceeds the light-emitting threshold voltage of each of the first light-emitting element and the second light-emitting element is supplied in common to the first circuit and the second circuit. That is, according to the invention, there is an advantage whereby it is possible to reduce power consumption while reliably making a face of the side which should be made to not emit light be in a non-luminescent state.

In the light emitting device according to the above aspect of the invention, the driving circuit may set the first switching element to be in an ON state and the second switching element to be in an OFF state, in a case where while an image is displayed on one face side of the substrate by the first circuit, an image is not displayed on the other face side of the substrate, and set the first switching element to be in an OFF state and the second switching element to be in an ON state, in a case where while an image is not displayed on one face side of the substrate, an image is displayed on the other face side of the substrate by the second circuit. However, it is not limited thereto, and the driving circuit may set the second switching element to be in an ON state, even in a case where while an image is displayed on one face side of the substrate by the first circuit, an image is not displayed on the other face side of the substrate, and set the first switching element to be in an ON state, even in a case where while an image is not displayed on one face side of the substrate, an image is displayed on the other face side of the substrate by the second circuit.

Also, according to another aspect of the invention, there is provided a light emitting device including: a plurality of first scanning lines each extending in a first direction; a plurality of second scanning lines which is provided in a one-to-one corresponding to the plurality of first scanning lines; a plurality of data lines each extending in a second direction different from the first direction; a plurality of pixel circuits which is disposed corresponding to each intersection of the plurality of first and second scanning lines and the plurality of data lines; and a driving circuit which drives each of the pixel circuits, wherein each of the pixel circuits includes a first circuit provided corresponding to a first electric supply line, and a second circuit provided corresponding to a second electric supply line, which are disposed on a substrate, the first circuit includes a first light-emitting element which includes a first electrode electrically connected to the first electric supply line and a second electrode which faces the first electrode, a first driving transistor electrically connected to the first electrode, a first capacitive element for holding the potential of the gate of the first driving transistor, and a first switching element which is provided between the gate of the first driving transistor and the data line, thereby making the gate of the second driving transistor and the data line be in an electrically conductive state at the time of selection of the first scanning line, wherein emitted light of the first light-emitting element is extracted from one face side of the substrate, the second circuit includes a second light-emitting element which includes a third electrode electrically connected to the second electric supply line and the second electrode which faces the third electrode, a second driving transistor electrically connected to the third electrode, a second capacitive element for holding the potential of the gate of the second driving transistor, and a second switching element which is provided between the gate of the second driving transistor and the data line, thereby making the gate of the second driving transistor and the data line be in an electrically conductive state at the time of selection of the second scanning line, wherein emitted light of the second light-emitting element is extracted from the other face side of the substrate, and in a case where while an image is displayed on one face side of the substrate by the first circuit, an image is not displayed on the other face side of the substrate, the driving circuit sequentially selects the respective first scanning lines for each selection period without selecting the respective second scanning lines, outputs a data potential according to image data to each of the data lines, sets the potential of the first electric supply line to be a value where voltage between the first electrode and the second electrode of the first light-emitting element exceeds the light-emitting threshold voltage of the first light-emitting element, and sets the potential of the second electric supply line to be a value where voltage between the third electrode and the second electrode of the second light-emitting element falls below the light-emitting threshold voltage of the second light-emitting element, and in a case where while an image is not displayed on one face side of the substrate, an image is displayed on the other face side of the substrate by the second circuit, the driving circuit sequentially selects the respective second scanning lines for each selection period without selecting the respective first scanning lines, outputs the data potential to the data line, sets the potential of the first electric supply line to be a value where voltage between the first electrode and the second electrode of the first light-emitting element falls below the light-emitting threshold voltage of the first light-emitting element, and sets the potential of the second electric supply line to be a value where voltage between the third electrode and the second electrode of the second light-emitting element exceeds the light-emitting threshold voltage of the second light-emitting element.

In the above aspect of the invention, in each pixel circuit, a power supply voltage is supplied from a separate power supply line to each of the first circuit for generating an image which is displayed on one face side of the substrate and the second circuit for generating an image which is displayed on the other face side of the substrate. Then, in a case where while an image is displayed on one face side of the substrate by the first circuit, an image is not displayed on the other face side of the substrate, since the driving circuit sets the potential of the second electric supply line to be a value where the voltage between the third electrode and the second electrode of the second light-emitting element falls below the light-emitting threshold voltage of the second light-emitting element, without driving each second circuit, an electric current does not flow in the second light-emitting element. Therefore, it is possible to reliably make the other face side of the substrate a non-luminescent state and also power consumption can be reduced compared to an aspect in which a power supply voltage which exceeds the light-emitting threshold voltage of each of the first light-emitting element and the second light-emitting element is supplied in common to each first circuit and each second circuit.

Also, in a case where while an image is not displayed on one face side of the substrate, an image is displayed on the other face side of the substrate by the second circuit, since the driving circuit sets the potential of the first electric supply line to be a value where the voltage between the first electrode and the second electrode of the first light-emitting element falls below the light-emitting threshold voltage of the first light-emitting element, without driving each first circuit, an electric current does not flow in the first light-emitting element. Therefore, it is possible to reliably make one face side of the substrate a non-luminescent state and also power consumption can be reduced compared to an aspect in which a power supply voltage which exceeds the light-emitting threshold voltage of each of the first light-emitting element and the second light-emitting element is supplied in common to each first circuit and each second circuit. That is, according to the invention, there is an advantage that it is possible to reduce power consumption of the light emitting device while reliably making a face of the side which should be made to not emit light be in a non-luminescent state.

The light emitting device related to the invention is used in various electronic apparatuses. A typical example of the electronic apparatus is an apparatus using a light emitting device as a display device. As the electronic apparatus related to the invention, a personal computer or a mobile telephone is illustrated.

According to still another aspect of the invention, there is provided a driving method of a light emitting device which includes a pixel circuit disposed on a substrate, and a driving circuit which drives the pixel circuit, wherein the pixel circuit includes a first circuit provided corresponding to a first electric supply line, and a second circuit provided corresponding to a second electric supply line, the first circuit includes a first light-emitting element which includes a first electrode electrically connected to the first electric supply line and a second electrode which faces the first electrode, a first driving transistor electrically connected to the first electrode, and a first capacitive element for holding the potential of the gate of the first driving transistor, wherein emitted light of the first light-emitting element is extracted from one face side of the substrate, and the second circuit includes a second light-emitting element which includes a third electrode electrically connected to the second electric supply line and the second electrode which faces the third electrode, a second driving transistor electrically connected to the third electrode, and a second capacitive element for holding the potential of the gate of the second driving transistor, wherein emitted light of the second light-emitting element is extracted from the other face side of the substrate, the method including: in a case where while an image is displayed on one face side of the substrate by the first circuit, an image is not displayed on the other face side of the substrate, setting the potential of the gate of the first driving transistor to be a data potential according to image data, setting the potential of the first electric supply line to be a value where voltage between the first electrode and the second electrode of the first light-emitting element exceeds the light-emitting threshold voltage of the first light-emitting element, and setting the potential of the second electric supply line to be a value where voltage between the third electrode and the second electrode of the second light-emitting element falls below the light-emitting threshold voltage of the second light-emitting element, and in a case where while an image is not displayed on one face side of the substrate, an image is displayed on the other face side of the substrate by the second circuit, outputting the data potential to a data line, setting the potential of the first electric supply line to be a value where voltage between the first electrode and the second electrode of the first light-emitting element falls below the light-emitting threshold voltage of the first light-emitting element, and setting the potential of the second electric supply line to be a value where voltage between the third electrode and the second electrode of the second light-emitting element exceeds the light-emitting threshold voltage of the second light-emitting element. Also by the above driving method, the same effects as those of the light emitting device related to the invention can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

A. EMBODIMENT

Figure 1:
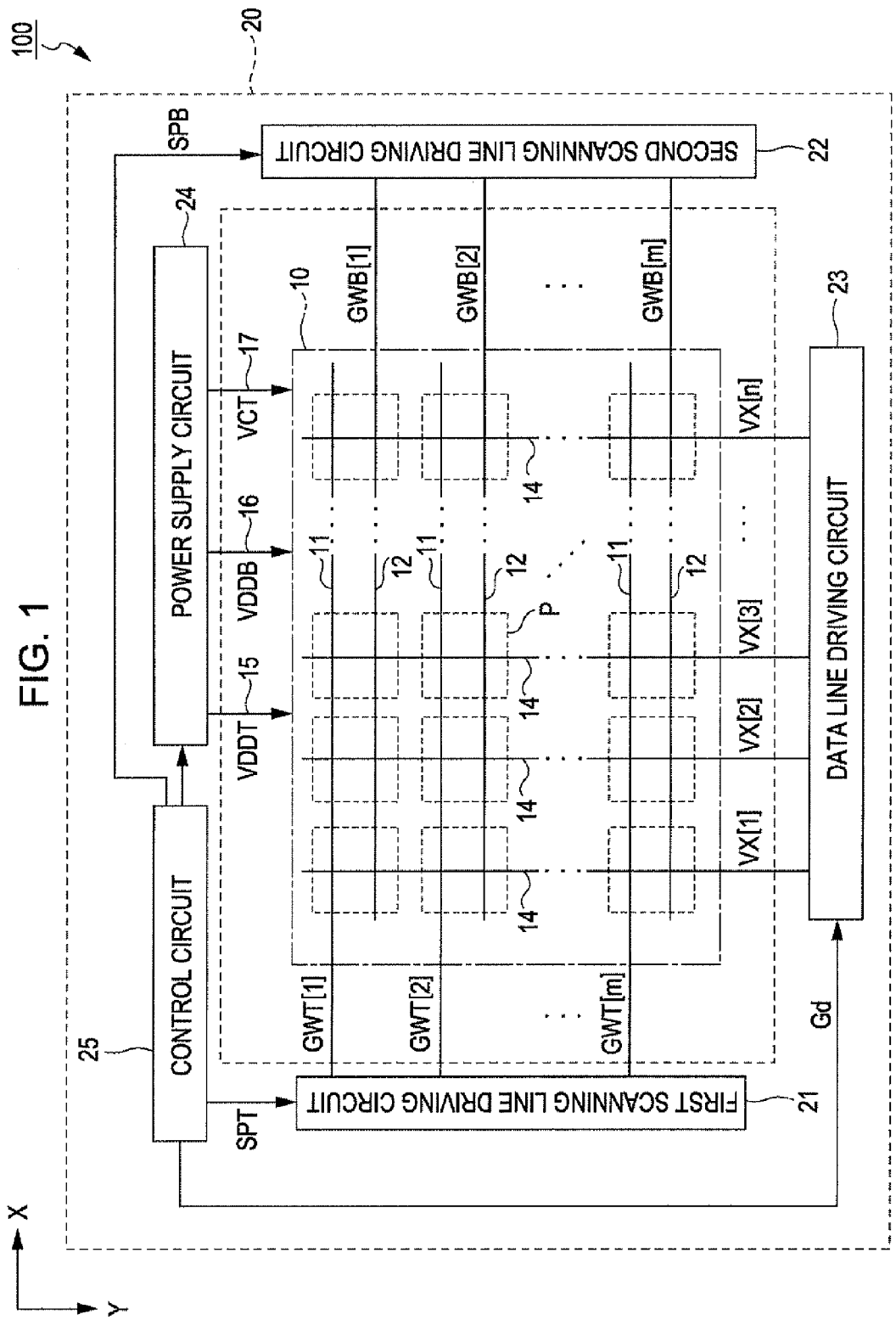
FIG. 1 is a block diagram of a light emitting device related to an embodiment of the invention.

FIG. 1 is a block diagram of a light emitting device 100 related to an embodiment of the invention. The light emitting device 100 is mounted on an electronic apparatus as a display device which displays an image. As shown in FIG. 1, the light emitting device 100 includes an element section 10, in which a plurality of pixel circuits P is arranged, and a driving circuit 20 which drives each pixel circuit P. The driving circuit 20 is configured to include a first scanning line driving circuit 21, a second scanning line driving circuit 22, a data line driving circuit 23, a power supply circuit 24, and a control circuit 25 which controls operations of these circuits. The driving circuit 20 is mounted being distributed, for example, into a plurality of integrated circuits. However, at least a portion of the driving circuit 20 can be constituted by a thin-film transistor formed on a substrate along with the pixel circuit P.

At the element section 10, m first scanning lines 11 extending in an X direction, m second scanning lines 12 each extending in the X direction in a pair with each first scanning line 11, and n data lines 14 which extend in the Y direction intersecting the X direction are formed (m and n are natural numbers). The plurality of pixel circuits P is disposed at positions corresponding to the intersections of the plurality of first and second scanning lines 11 and 12 and the plurality of data lines 14, thereby being arranged in a matrix form of m rows vertically×n columns horizontally.

Each of the first scanning line driving circuit 22 and the second scanning line driving circuit 22 is configured to include a shift register. The first scanning line driving circuit 22 generates m first scanning signals GWT[1] to GWT[m] equivalent to the total number of first scanning lines 11 (the number of rows of the pixel circuits P) by sequentially transmitting a start pulse SPT which is supplied from the control circuit 25 and then outputs the first scanning signal to each first scanning line 11. Similarly, the second scanning line driving circuit 22 generates m second scanning signals GWB[1] to GWB[m] by sequentially transmitting a start pulse SPB which is supplied from the control circuit 25 and then outputs the second scanning signal to each second scanning line 12.

Figure 2:
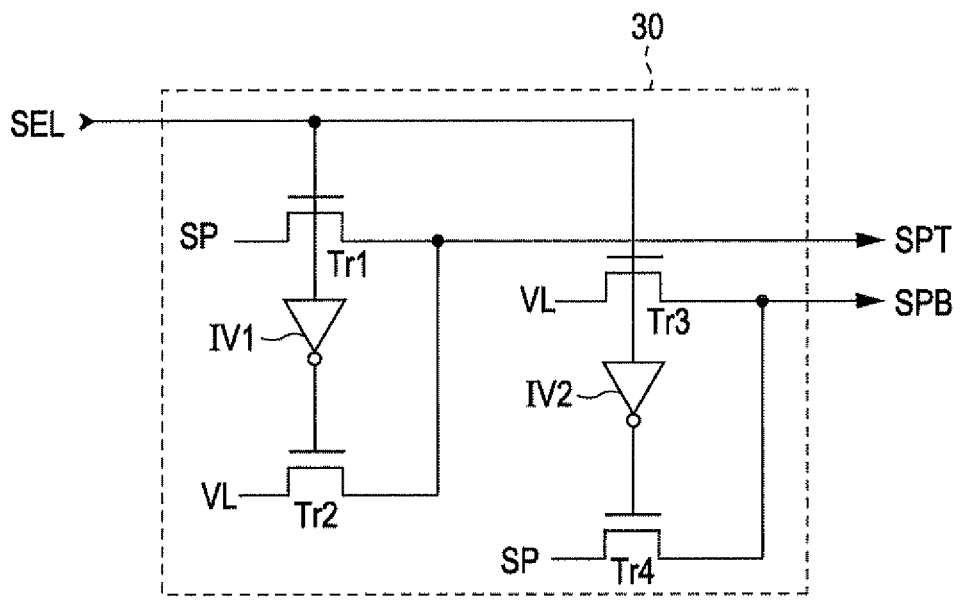
FIG. 2 is a circuit diagram of a signal selection circuit.

In this embodiment, the control circuit 25 does not simultaneously drive the first scanning line driving circuit 21 and the second scanning line driving circuit 22, but selectively drive only either one. More specifically, it is as follows. The control circuit 25 includes a signal selection circuit 30 shown in FIG. 2. The signal selection circuit 30 outputs a start pulse SP to either one of the first scanning line driving circuit 21 or the second scanning line driving circuit 22 in accordance with a selection signal SEL and does not output the start pulse SP to the other. Accordingly, a state is created where only one of either the first scanning line driving circuit 21 or the second scanning line driving circuit 22 is driven. In this embodiment, the start pulse SP which is output to the first scanning line driving circuit 21 is denoted by SPT and the start pulse SP which is output to the second scanning line driving circuit 22 is denoted by SPB. As shown in FIG. 2, the signal selection circuit 30 is configured to include transistors (Tr1, Tr2, Tr3, and Tr4) and inverters (IV1 and IV2). A specific operation of the signal selection circuit 30 will be described later.

The data line driving circuit 23 shown in FIG. 1 outputs each of data potentials VX[1] to VX[n] according to image data Gd which is supplied from the control circuit 25, to each data line 14. The power supply circuit 24 generates a high potential side first power supply potential VDDT, a high potential side second power supply potential VDDB, and a low potential side third power supply potential VCT. The first power supply potential VDDT is supplied in common to the respective pixel circuits P through a first electric supply line 15. The second power supply potential VDDB is supplied in common to the respective pixel circuits P through a second electric supply line 16. The third power supply potential VCT is supplied in common to the respective pixel circuits P through a third electric supply line 17.

Figure 3:
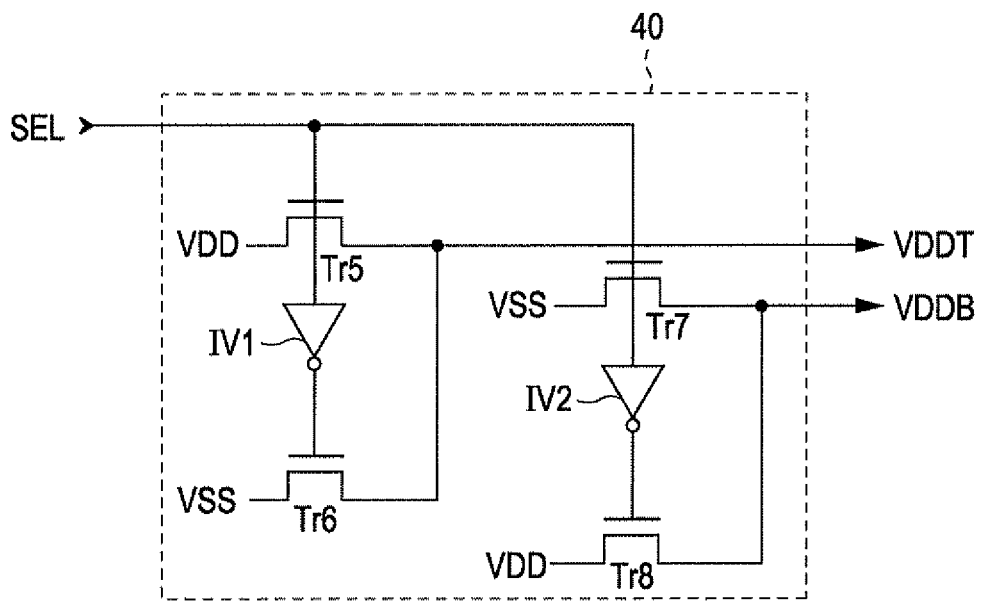
FIG. 3 is a circuit diagram of a power supply switching circuit.

The power supply circuit 24 includes a power supply switching circuit 40 shown in FIG. 3. The power supply switching circuit 40 sets either one of the first power supply potential VDDT or the second power supply potential VDDB to be a high level potential VDD and the other to be a low level potential VSS lower than the high level potential, in accordance with the selection signal SEL which is supplied from the control circuit 25. As shown in FIG. 3, the power supply switching circuit 40 is configured to include transistors (Tr5, Tr6, Tr7, and Tr8) and inverters (IV3 and IV4). A specific operation of the power supply switching circuit 40 will be described later.

Figure 4:
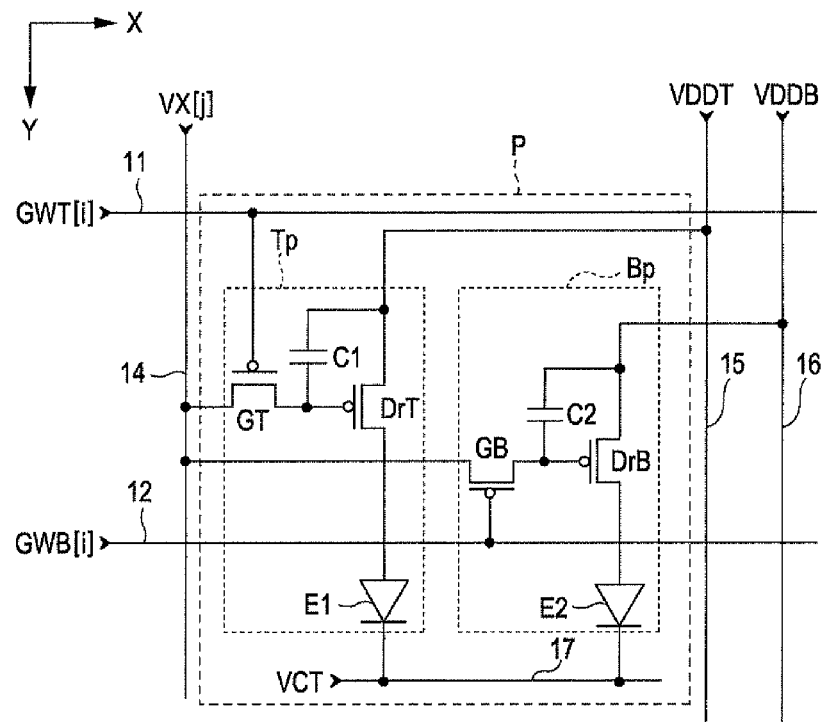
FIG. 4 is a circuit diagram of a pixel circuit.

FIG. 4 is a circuit diagram of the pixel circuit P. In FIG. 4, only one pixel circuit P which is located at the j-th column (j=1 to n) of the i-th row (i=1 to m) is representatively shown. As shown in FIG. 4, the pixel circuit P is configured to include a first circuit Tp and a second circuit Bp. The first circuit Tp is provided corresponding to the first electric supply line 15, to which the first power supply potential VDDT is supplied. The second circuit Bp is provided corresponding to the second electric supply line 16, to which the second power supply potential VDDB (>VCT) is supplied. The third electric supply line 17, to which the third power supply potential VCT (<VDDT and VDDB) is supplied, is common to the first circuit Tp and the second circuit Bp.

As shown in FIG. 4, the first circuit Tp is configured to include a first light-emitting element E1, a first driving transistor DrT, a first capacitive element C1, and a first switching element GT. The first light-emitting element E1 and the first driving transistor DrT are disposed in series on a path connecting the first electric supply line 15 and the third electric supply line 17. The first light-emitting element E1 is an OLED element in which a light-emitting layer made of an organic EL (Electroluminescence) material is interposed between an anode and a cathode, which face each other.

The first driving transistor DrT is a P-channel type transistor (for example, a thin-film transistor) in which the source is connected to the first electric supply line 15 and also the drain is connected to the anode of the first light-emitting element E1. The first capacitive element C1 is interposed between a gate and the source of the first driving transistor DrT.

The first switching element GT is interposed between the gate of the first driving transistor DrT and the data line 14 of the j-th column, thereby controlling electric connection (conduction/non-conduction) between them. As shown in FIG. 4, for example, a P-channel type transistor (for example, a thin-film transistor) is preferably adopted as the first switching element GT. The gates of the respective first switching elements GT of the n pixel circuits P belonging to the i-th row are connected in common to the first scanning line 11 of the i-th row.

On the other hand, as shown in FIG. 4, the second circuit Bp is configured to include a second light-emitting element E2, a second driving transistor DrB, a second capacitive element C2, and a second switching element GB. The second light-emitting element E2 and the second driving transistor DrB are disposed in series on a path connecting the second electric supply line 16 and the third electric supply line 17. The second light-emitting element E2 is an OLED element.

The second driving transistor DrB is a P-channel type transistor (for example, a thin-film transistor) in which the source is connected to the second electric supply line 16 and also the drain is connected to an anode of the second light-emitting element E2. The second capacitive element C2 is interposed between a gate and the source of the second driving transistor DrB.

The second switching element GB is interposed between the gate of the second driving transistor DrB and the data line 14 of the j-th column, thereby controlling electric connection (conduction/non-conduction) between them. As shown in FIG. 4, for example, a P-channel type transistor (for example, a thin-film transistor) is preferably adopted as the second switching element GB. The gates of the respective second switching elements GB of the n pixel circuits P belonging to the i-th row are connected in common to the second scanning line 12 of the i-th row.

Figure 5:
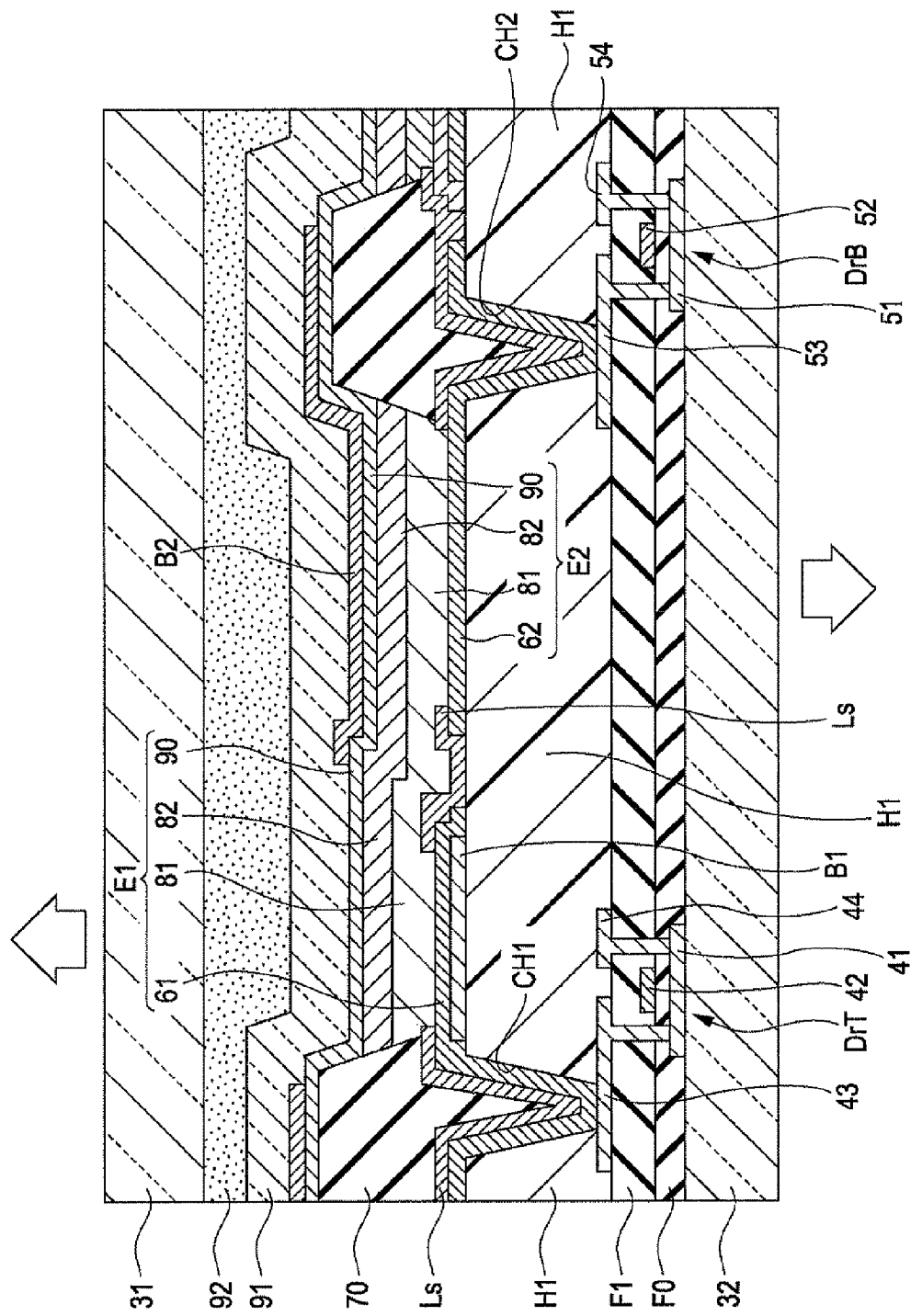
FIG. 5 is a cross-sectional view of the pixel circuit.

FIG. 5 is a cross-sectional view of the pixel circuit P described above. In this embodiment, a configuration is provided in which each pixel circuit P is disposed between a first substrate 31 and a second substrate 32, which face each other. The first substrate 31 and the second substrate 32 are composed of a material having light transparency, such as glass. In this embodiment, emitted light of the first light-emitting element E1 of each pixel circuit P is extracted from the first substrate 31 side and emitted light of the second light-emitting element E2 of each pixel circuit P is extracted from the second substrate 32 side. Hereinafter, the specific contents are described. In addition, in a case where elements constituting the pixel circuit are provided on the second substrate 32 and the first substrate 31 is used as a protective substrate, a protective film which includes a thin film made of an organic material or an inorganic material may be used as an alternative of the first substrate 31.

As shown in FIG. 5, on the second substrate 32, various transistors which are included in the pixel circuit P are formed. Here, the first driving transistor DrT and the second driving transistor DrB are representatively shown. The first driving transistor DrT includes a semiconductor layer 41 formed of a semiconductor material on the surface of the second substrate 32, and a gate electrode 42 which faces the semiconductor layer 41 with a gate insulating layer FO covering the semiconductor layer 41 interposed therebetween. The semiconductor layer 41 is, for example, a polysilicon film body formed by performing laser annealing on amorphous silicon. The gate electrode 42 is covered by a first insulating layer F1. A drain electrode 43 and a source electrode 44 of the first driving transistor DrT are formed of low-resistance metal such as aluminum on the surface of the first insulating layer F1 and also electrically connected to the semiconductor layer 41 (a drain region and a source region) through contact holes.

The second driving transistor DrB includes a semiconductor layer 51 formed of a semiconductor material on the surface of the second substrate 32, and a gate electrode 52 which faces the semiconductor layer 51 with the gate insulating layer FO covering the semiconductor layer 51 interposed therebetween. Similarly to the first driving transistor DrT, the gate electrode 52 is covered by the first insulating layer F1. A drain electrode 53 and a source electrode 54 of the second driving transistor DrB are formed of low-resistance metal such as aluminum on the surface of the first insulating layer F1 and also electrically connected to the semiconductor layer 51 (a drain region and a source region) through contact holes.

The drain electrode 43 and the source electrode 44 of the first driving transistor DrT and the drain electrode 53 and the source electrode 54 of the second driving transistor DrB are covered by a planarization layer H1. On the surface of the planarization layer H1, a first pixel electrode 61 constituting the anode of the first light-emitting element E1 and a second pixel electrode 62 constituting the anode of the second light-emitting element E2 are formed apart from each other. The first pixel electrode 61 and the drain electrode 43 of the first driving transistor DrT are connected to each other through a contact hole CH1 formed in the planarization layer H1. Also, the second pixel electrode 62 and the drain electrode 53 of the second driving transistor DrE are connected to each other through a separate contact hole CH2 formed in the planarization layer H1.

On the first pixel electrode 61 and the second pixel electrode 62, an organic bank 70 (a separator) is formed. The organic bank 70 is for partitioning a space on the surface of the second substrate 32 for each pixel circuit P and is formed of a transparent insulating material, for example, acryl, polyimide, or the like. On the first pixel electrode 61 and the second pixel electrode 62 in a space partitioned by the organic bank 70, a laminated body (a light-emitting functional layer) of a hole injecting/transporting layer 81 and an organic EL layer 82 is formed. Further, an opposite electrode 90 is formed so as to cover the light-emitting functional layer of each pixel circuit P and each organic bank 70. That is, the opposite electrode 90 is continuous over a plurality of pixel circuits P and constitutes the cathodes of the first light-emitting element E1 and the second light-emitting element E2 of each pixel circuit P.

Also, as shown in FIG. 5, lyophilic control layers Ls composed of a lyophilic material such as $SiO_2$ are formed between the organic bank 70 and the planarization layer H1 and between the first pixel electrode 61 and the second pixel electrode 62. Also, as shown in FIG. 5, a transparent protective film 91 is formed on the opposite electrode 90. The transparent protective film 91 is a member (gas barrier member) for transmitting the emitted light and also preventing infiltration of moisture or oxygen from the outside and can be composed of silicon oxide ($SiO_x$), silicon nitride ($SiN_x$), or the like. An adhesive layer 92 is formed on the transparent protective film 91. The adhesive layer 92 has a function of sticking the first substrate 31 to the transparent protective film 91.

Here, as shown in FIG. 5, a first light shielding film B1 is provided between the first pixel electrode 61 and the planarization layer H1 so as to prevent the emitted light of the first light-emitting element E1 from advancing to the second substrate 32 side. More specifically, the first light shielding film B1 is provided so as to cover a region (a light-emitting region of the first light-emitting element E1) where the emitted light of the first light-emitting element E1 can reach, in the region on the surface of the planarization layer H1. The first light shielding film B1 can be composed of a material having light reflectivity, such as aluminum or chromium. Accordingly, light radiated from the first light-emitting element E1 to the second substrate 32 side is reflected by the first light shielding film B1, thereby becoming light directed towards the first substrate 31 side, and passes through the opposite electrode 90 and the first substrate 31 along with light radiated from the first light-emitting element E1 to the first substrate 31 side, thereby being emitted to the outside. That is, the emitted light of the first light-emitting element E1 is extracted from the first substrate 31 side.

Further, as shown in FIG. 5, on the surface of the opposite electrode 90, a second light shielding film B2 is provided so as to prevent the emitted light of the second light-emitting element E2 from advancing to the first substrate 31 side, More specifically, the second light shielding film B2 is provided so as to cover a region (a light-emitting region of the second light-emitting element E2) where the emitted light of the second light-emitting element E2 can reach, in the region on the surface of the opposite electrode 90. The second light shielding film B2 can be composed of a material having light reflectivity, such as aluminum or chromium. Accordingly, light radiated from the second light-emitting element E2 to the first substrate 31 side is reflected by the second light shielding film B2, thereby becoming light directed towards the second substrate 32 side, and passes through the second pixel electrode 62 and the second substrate 32 along with light radiated from the second light-emitting element E2 to the second substrate 32 side, thereby being emitted to the outside. That is, a state is created where the emitted light of the second light-emitting element E2 is extracted from the second substrate 32 side.

Next, a specific operation (driving method) of the light emitting device 100 related to this embodiment will be described. In this embodiment, the driving circuit 20 selectively allows either one of a face of the first substrate 31 side of a panel (the element section 10) or a face of the second substrate 32 to emit light. Hereinafter, the specific contents are described.

Figure 6:
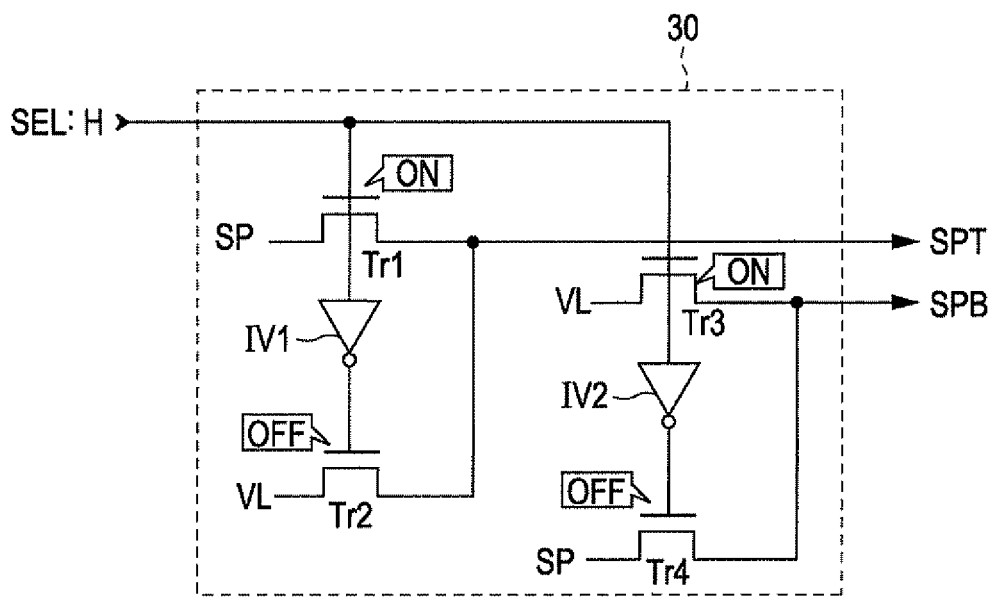
FIG. 6 is a diagram for describing an operation of the signal selection circuit in a case where while an image is displayed on a first substrate side, an image is not displayed on a second substrate side.

First, a case where while an image is displayed on a face of the first substrate 31 side of the panel, an image is not displayed on a face of the second substrate 32 side is assumed. In this case, the control circuit 25 sets the selection signal SEL to be a high level. Therefore, as shown in FIG. 6, since the transistors Tr1 and Tr3 of the signal selection circuit 30 are set to be in an ON state and the transistors Tr2 and Tr4 are set to be in an OFF state, while the start pulse SP (SPT) is output to the first scanning line driving circuit 21, the start pulse SPB which is output to the second scanning line driving circuit 22 is fixed at a low level potential VL. That is, since the start pulse SP is not output to the second scanning line driving circuit 22, the second scanning line driving circuit 22 is in a non-driving state.

Figure 7:
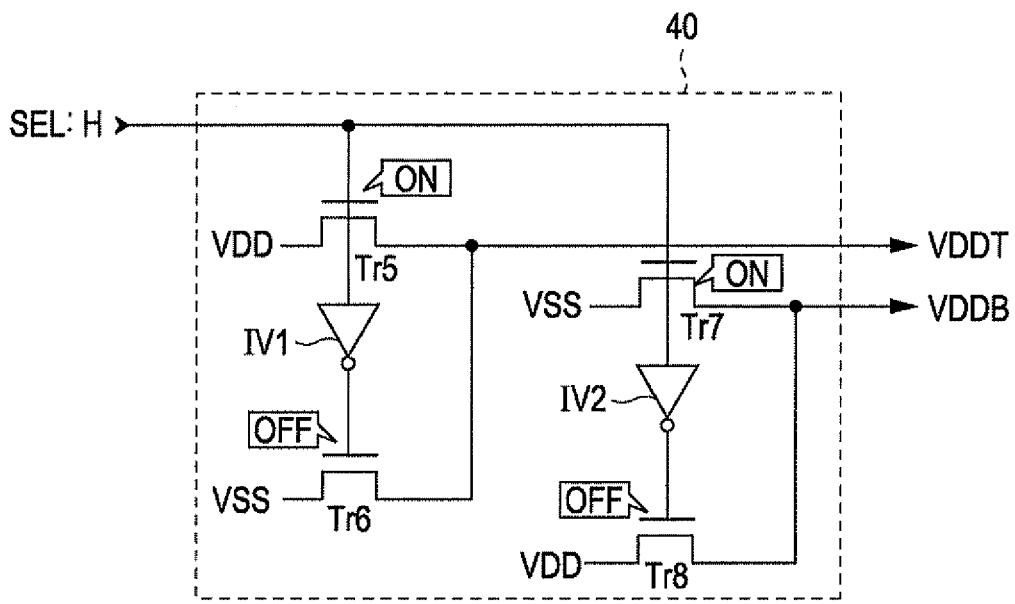
FIG. 7 is a diagram for describing an operation of the power supply switching circuit in a case where while an image is displayed on the first substrate side, an image is not displayed on the second substrate side.

Also, at this time, as shown in FIG. 7, since the transistors Tr5 and Tr7 of the power supply switching circuit 40 are set to be in an ON state and the transistors Tr6 and Tr8 are set to be in an OFF state, while the value of the first power supply potential VDDT which is output to the first electric supply line 15 is set to be the high level potential VDD, the value of the second power supply potential VDDB which is output to the second electric supply line 16 is set to be the low level potential VSS.

Figure 8:
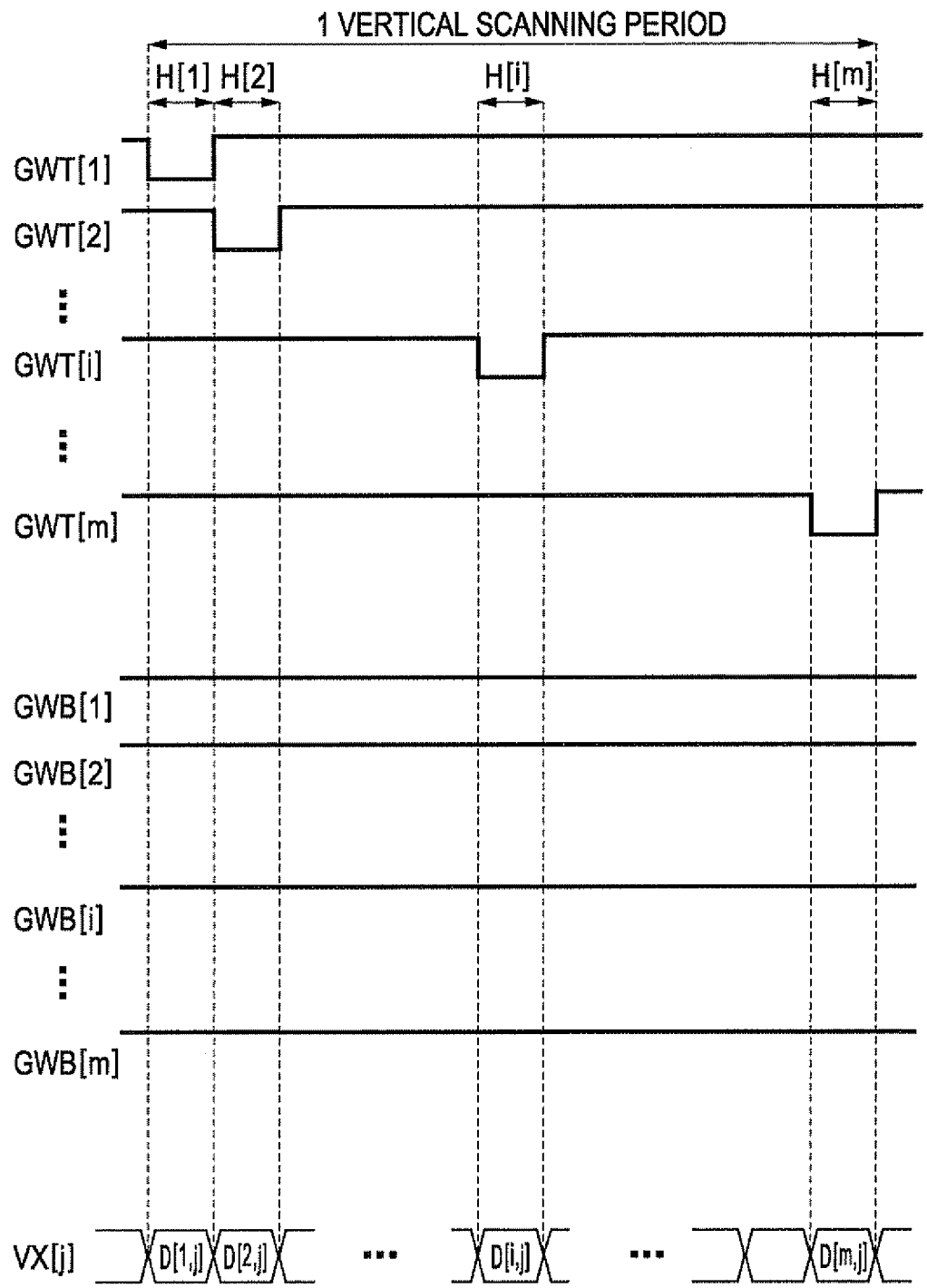
FIG. 8 is a timing chart for describing a specific operation of the light emitting device in a case where while an image is displayed on the first substrate side, an image is not displayed on the second substrate side.

FIG. 8 is a timing chart for describing a specific operation of the light emitting device 100 in a case where while an image is displayed on a face of the first substrate 31 side of the panel, an image is not displayed on a face of the second substrate 32 side. As shown in FIG. 8, the first scanning line driving circuit 21 sequentially selects the respective first scanning line 11 by sequentially setting the first scanning signals GWT[1] to GWT[m] to be an active level (low level) in each of m horizontal scanning periods (H[1] to H[m]) in a vertical scanning period. A transition of the first scanning signal GWT[i] to a low level means selection of the first scanning line 11 of the i-th row. If the first scanning signal GWT[i] transitions to a low level, the respective first switching elements GT of the n pixel circuits P belonging to the i-th row simultaneously change to an ON state.

On the other hand, since the second scanning line driving circuit 22 is in a non-driving state, the second scanning signals GWB[1] to GWB[m] are maintained at a non-active level (high level). Therefore, the second switching element GB of each pixel circuit P is maintained at an OFF state.

Also, the data line driving circuit 23 generates a data potential VX according to the image data and outputs it to each data line 14, in each horizontal scanning period H. As shown in FIG. 8, the value of the data potential VX[j] which is output to the data line 14 of the j-th column in the i-th horizontal scanning period H[i] is denoted by D[i,j].

Figure 9:
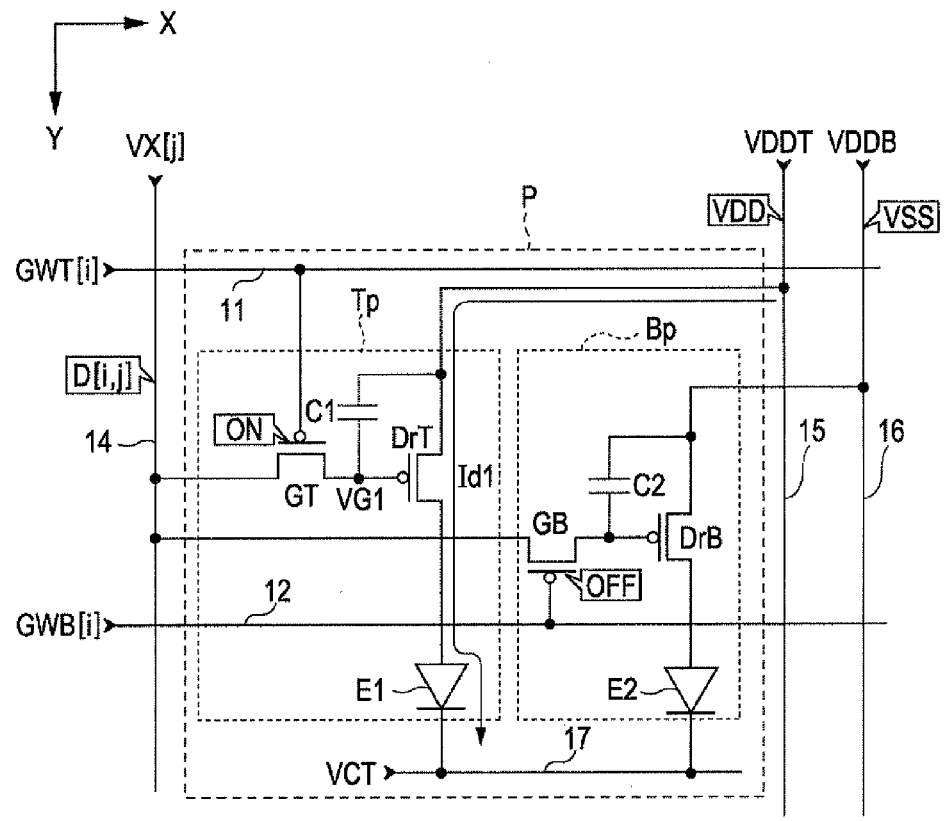
FIG. 9 is a diagram for describing an operation of the pixel circuit in a case where while an image is displayed on the first substrate side, an image is not displayed on the second substrate side.

Now, an operation of the light emitting device 100 is described focusing on the pixel circuit P of the j-th column of the i-th row. As shown in FIG. 8, if the i-th horizontal scanning period H[i] in the vertical scanning period is started, the first scanning line driving circuit 21 sets the first scanning signal GWT[i] which is output to the first scanning line 11 of the i-th row, to be a low level (active level). On the other hand, the second scanning signal GWB[i] is maintained at a high level (non-active level). Therefore, as shown in FIG. 9, while the first switching element GT is set to be in an ON state, the second switching element GB is set to be in an OFF state. Also, as shown in FIGS. 8 and 9, the data line driving circuit 23 sets the value of the data potential VX[j] which is output to the data line 14 of the j-th column, to be a potential D[i,j]. Further, as shown in FIGS. 7 and 9, the power supply circuit 24 outputs the high level potential VDD to the first electric supply line 15 and on the other hand, outputs the low level potential VSS to the second electric supply line 16. In this embodiment, the difference in potential between the high level potential VDD and the third power supply potential VCT which is supplied to the third electric supply line 17 is set so as to sufficiently exceed the value of each of the light-emitting threshold voltage Vth_el1 of the first light-emitting element E1 and the light-emitting threshold voltage Vth_el2 of the second light-emitting element E2. Also, the difference in potential between the low level potential VSS and the third power supply potential VCT is set so as to sufficiently fall below the value of each of the light-emitting threshold voltage Vth_el1 of the first light-emitting element E1 and the light-emitting threshold voltage Vth_el2 of the second light-emitting element E2.

At this time, since the gate of the first driving transistor DrT is electrically connected to the data line 14 of the j-th column through the first switching element GT which is in an ON state, a potential VG1 of the gate of the first driving transistor DrT is set to be the potential D[i,j]. Accordingly, a driving current Id1 according to the potential D[i,j] is generated at the first driving transistor DrT and the generated driving current Id1 flows through the first light-emitting element E1. The first light-emitting element E1 emits light at a luminance according to the driving current Id1.

On the other hand, since the second switching element GB is set to be in an OFF state, the data potential VX[j] which is output to the data line 14 of the j-th column is not supplied to the gate of the second driving transistor DrB. Also, at this time, since the value of the second power supply potential VDDB which is output to the second electric supply line 16 is set to be the low level potential VSS and the difference in potential between the potential VSS and the third power supply potential VCT falls below the light-emitting threshold voltage Vth_el2 of the second light-emitting element E2, an electric current does not flow in the second light-emitting element E2, so that the second light-emitting element becomes a non-luminescent state. For example, at this time, even if the data potential VX[j] written to the second circuit Bp at the time of previous light-emitting of the second circuit Bp is held by the second capacitive element C2, so that the second driving transistor DrB is in an electrically conductive state, since the difference in potential between the potential VSS which is supplied to the second electric supply line 16 and the third power supply potential VCT which is supplied to the third electric supply line 17 falls below the light-emitting threshold voltage Vth_el2, an electric current does not flow in the second light-emitting element E2, so that the second light-emitting element does not emit light. Therefore, it is possible to reliably make the second light-emitting element E2 a non-luminescent state and also power consumption can be reduced compared to an aspect in which the high level potential VDD is supplied in common to the first circuit Tp and the second circuit Bp of each pixel circuit P.

Thereafter, if the horizontal scanning period H[i] is ended and the next (i+1)th horizontal scanning period H[i+1] is started, the first scanning signal GWT[i] is set to be a non-active level (high level). Therefore, the first switching element GT transitions to an OFF state. Here, even if the first switching element GT becomes an OFF state, since the potential VG1 of the gate of the first driving transistor DrT is maintained at the potential D[i,j] at an ending point of the i-th horizontal scanning period H[i] by the first capacitive element C1, the above-mentioned driving current Id1 continues to flow through in the first light-emitting element E1. That is, a state is created where the first light-emitting element E1 continues to emit light at a luminance according to the above-mentioned driving current Id1 in a period until the i-th horizontal scanning period H[i] in the next vertical scanning period is started.

Figure 10:
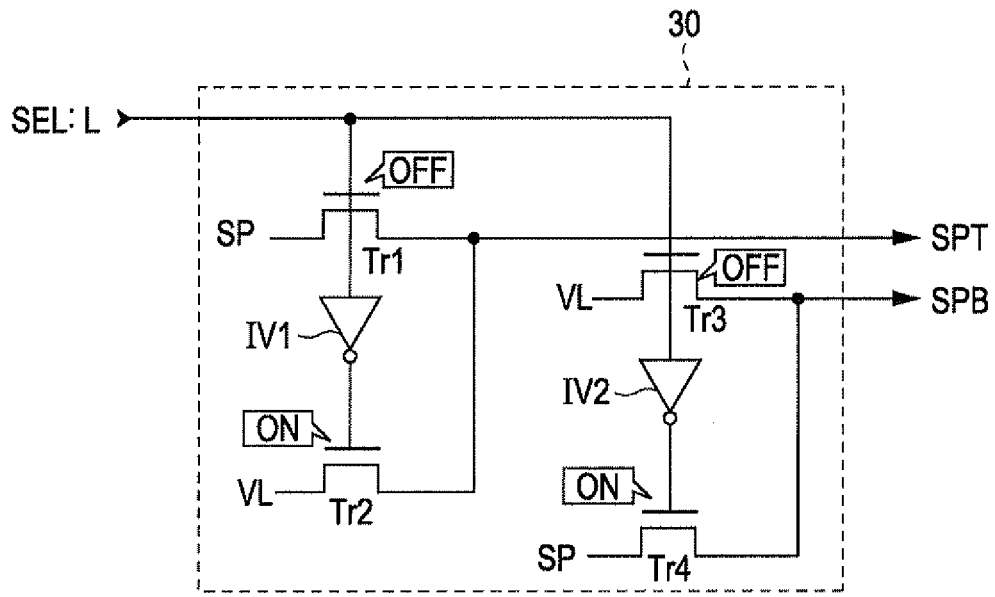
FIG. 10 is a diagram for describing an operation of the signal selection circuit in a case where while an image is displayed on the second substrate side, an image is not displayed on the first substrate side.

Next, a case where while an image is displayed on a face of the second substrate 32 side of the panel, an image is not displayed on a face of the first substrate 31 side is assumed. In this case, the control circuit 25 sets the selection signal SEL to be a low level. Therefore, as shown in FIG. 10, since the transistors Tr2 and Tr4 of the signal selection circuit 30 are set to be in an ON state and the transistors Tr1 and Tr3 are set to be in an OFF state, while the start pulse SP (SPB) is output to the second scanning line driving circuit 22, the start pulse SPT which is output to the first scanning line driving circuit 21 is fixed at a low level potential VL. That is, since the start pulse SP is not output to the first scanning line driving circuit 21, the first scanning line driving circuit 21 is in a non-driving state.

Figure 11:
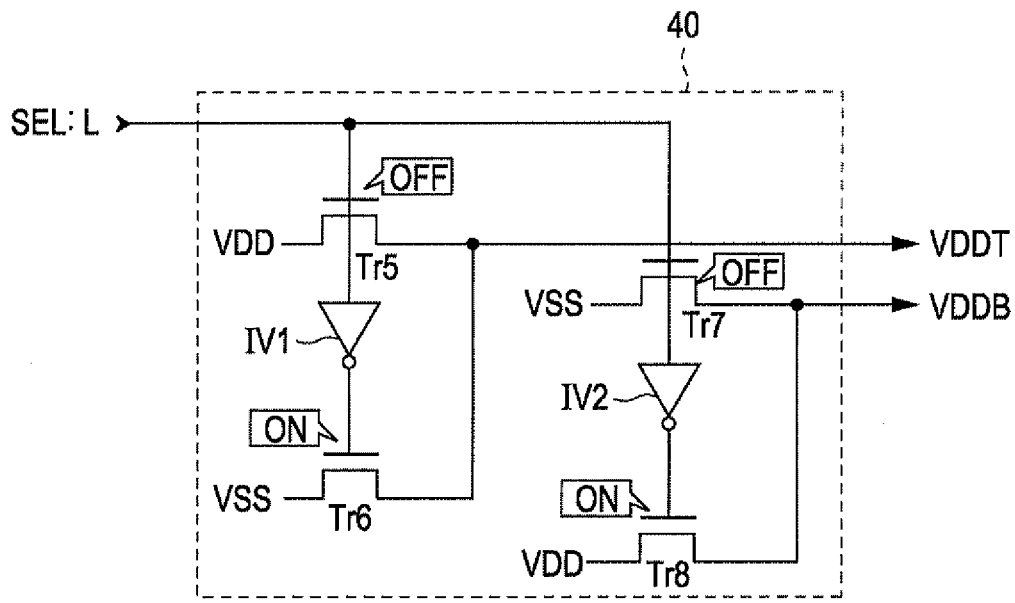
FIG. 11 is a diagram for describing an operation of the power supply switching circuit in a case where while an image is displayed on the second substrate side, an image is not displayed on the first substrate side.

Also, at this time, as shown in FIG. 11, since the transistors Tr6 and Tr8 of the power supply switching circuit 40 are set to be in an ON state and the transistors Tr5 and Tr7 are set to be in an OFF state, while the value of the first power supply potential VDDT which is output to the first electric supply line 15 is set to be a low level potential VSS, the value of the second power supply potential VDDB which is output to the second electric supply line 16 is set to be a high level potential VDD.

Figure 12:
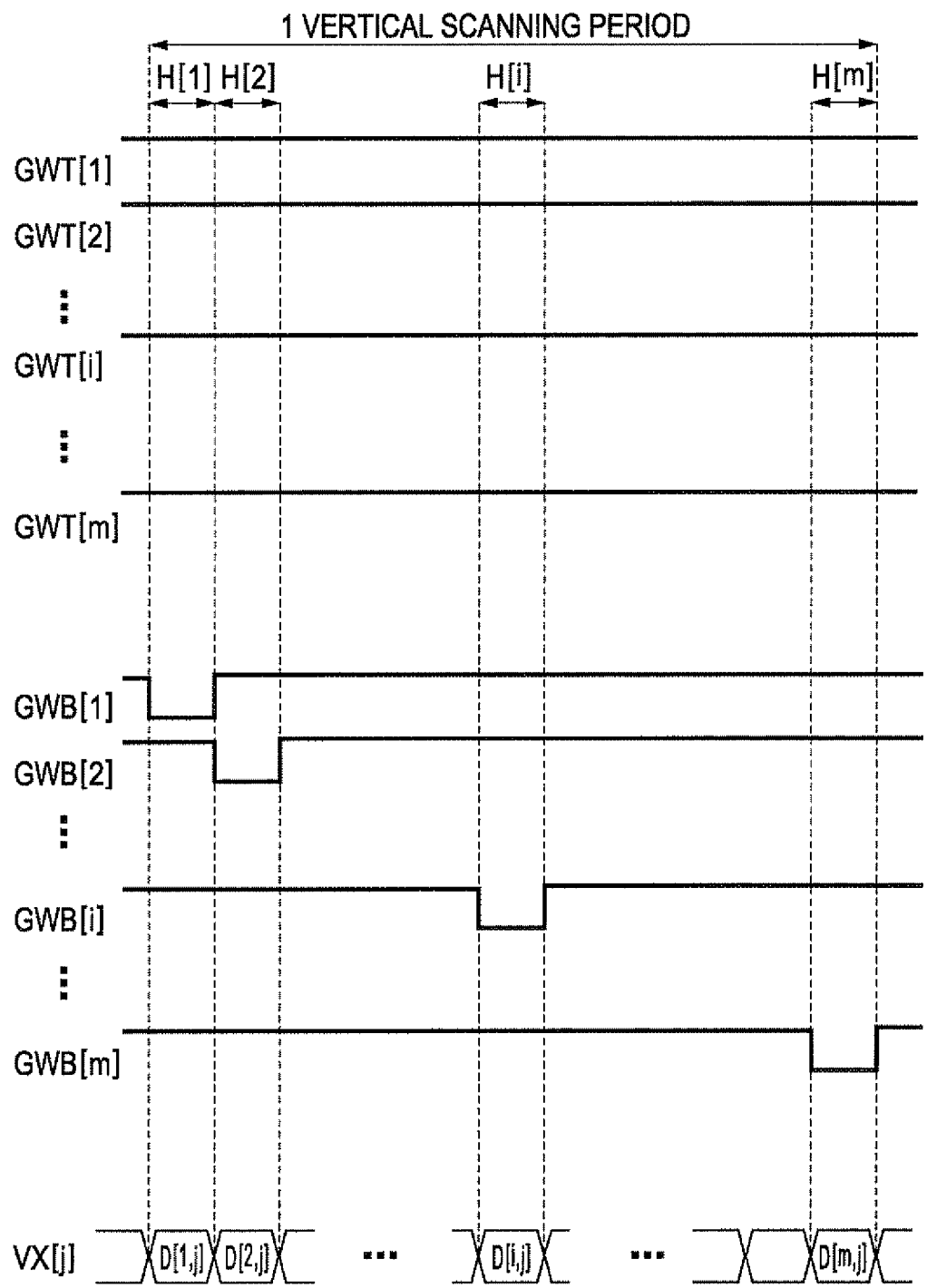
FIG. 12 is a timing chart for describing a specific operation of the light emitting device in a case where while an image is displayed on the second substrate side, an image is not displayed on the first substrate side.

FIG. 12 is a timing chart for describing a specific operation of the light emitting device 100 in a case where while an image is displayed on a face of the second substrate 32 side of the panel, an image is not displayed on a face of the first substrate 31 side. As shown in FIG. 12, the second scanning line driving circuit 22 sequentially selects the respective second scanning line 12 by sequentially setting the second scanning signals GWB[1] to GWB[m] to be an active level (low level) in each of m horizontal scanning periods (H [1] to H[m]) in the vertical scanning period. A transition of the second scanning signal GWB[i] to a low level means selection of the second scanning line 12 of the i-th row. If the second scanning signal GWB[i] transitions to a low level, the respective second switching elements GB of the n pixel circuits P belonging to the i-th row simultaneously change to an ON state.

On the other hand, since the first scanning line driving circuit 21 is in a non-driving state, the first scanning signals GWT[1] to GWT[m] are maintained at a non-active level (high level). Therefore, the first switching element GT of each pixel circuit P is maintained at an OFF state.

Also, the data line driving circuit 23 generates a data potential VX according to the image data and outputs it to each data line 14, in each horizontal scanning period H.

Figure 13:
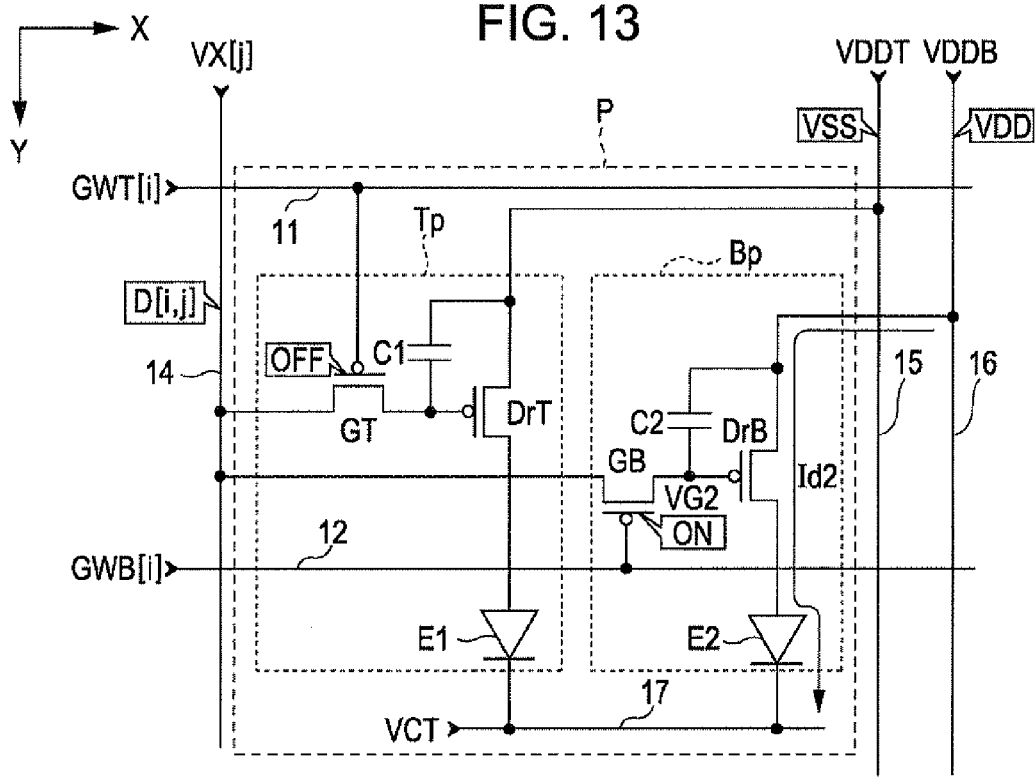
FIG. 13 is a diagram for describing an operation of the pixel circuit in a case where while an image is displayed on the second substrate side, an image is not displayed on the first substrate side.

Now, an operation of the light emitting device 100 is described focusing on the pixel circuit P of the j-th column of the i-th row. As shown in FIG. 12, if the i-th horizontal scanning period H[i] in the vertical scanning period is started, the second scanning line driving circuit 22 sets the second scanning signal GWB[i] which is output to the second scanning line 12 of the i-th row, to be a low level (active level). On the other hand, the first scanning signal GWT[i] is maintained at a high level (non-active level). Therefore, as shown in FIG. 13, while the second switching element GB is set to be in an ON state, the first switching element GT is set to be in an OFF state. Also, as shown in FIGS. 12 and 13, the data line driving circuit 23 sets the value of the data potential VX[j], which is output to the data line 14 of the j-th column, to be a potential D[i,j]. Further, as shown in FIGS. 11 and 13, the power supply circuit 24 outputs the high level potential VDD to the second electric supply line 16 and on the other hand, outputs the low level potential VSS to the first electric supply line 15.

At this time, since the gate of the second driving transistor DrB is electrically connected to the data line 14 of the j-th column through the second switching element GB which is in an ON state, a potential VG2 of the gate of the second driving transistor DrB is set to be the potential D[i,j]. Accordingly, a driving current Id2 according to the potential D[i,j] is generated at the second driving transistor DrB and the generated driving current Id2 flows through the second light-emitting element E2. The second light-emitting element E2 emits light at a luminance according to the driving current Id2.

On the other hand, since the first switching element GT is set to be in an OFF state, the data potential VX[j] which is output to the data line 14 of the j-th column is not supplied to the gate of the first driving transistor DrT. Also, at this time, since the value of the first power supply potential VDDT which is output to the first electric supply line 15 is set to be the low level potential VSS and the difference in potential between the potential VSS and the third power supply potential VCT falls below the light-emitting threshold voltage Vth_el1 of the first light-emitting element E1, an electric current does not flow in the first light-emitting element E1, so that the first light-emitting element becomes a non-luminescent state. For example, at this time, even if the data potential VX[j] written to the first circuit Tp at the time of previous light-emitting of the first circuit Tp is held by the first capacitive element C1, so that the first driving transistor DrT is in an electrically conductive state, since the difference in potential between the potential VSS which is supplied to the first electric supply line 15 and the third power supply potential VCT which is supplied to the third electric supply line 17 falls below the light-emitting threshold voltage Vth_el1, an electric current does not flow in the first light-emitting element E1, so that the first light-emitting element does not emit light. Therefore, it is possible to reliably make the first light-emitting element E1 a non-luminescent state and also power consumption can be reduced compared to an aspect in which the high level potential VDD is supplied in common to the first circuit Tp and the second circuit Bp of each pixel circuit P.

Thereafter, if the horizontal scanning period H[i] is ended and the next (i=1)th horizontal scanning period H[i+1] is started, the second scanning signal GWB[i] is set to be a non-active level (high level). Therefore, the second switching element GB transitions to an OFF state. Here, even if the second switching element GB is in an OFF state, since the potential VG2 of the gate of the second driving transistor DrB is maintained at the potential D[i,j] at an ending point of the horizontal scanning period H[i] by the second capacitive element C2, the above-mentioned driving current Id2 continues to flow in the second light-emitting element E2. That is, a state is created where the second light-emitting element E2 continues to emit light at a luminance according to the above-mentioned driving current Id2 in a period until the i-th horizontal scanning period H[i] in the next vertical scanning period is started.

As described above, in this embodiment, in a case where while an image is displayed on the first substrate 31 side, an image is not displayed on the second substrate 32 side, since the driving circuit 20 sets the value of the second power supply potential VDDB which is supplied to the second electric supply line 16, to be a value where the voltage between the second pixel electrode 62 and the opposite electrode 90 of the second light-emitting element E2 (the voltage between both ends of the second light-emitting element E2) falls below the light-emitting threshold voltage Vth_el2, an electric current does not flow in the second light-emitting element E2. Therefore, it is possible to reliably make the second substrate 32 side be in a non-luminescent state and also power consumption can be reduced compared to an aspect in which a power supply voltage which exceeds the light-emitting threshold voltage of each of the first light-emitting element E1 and the second light-emitting element E2 is supplied in common to the first circuit Tp and the second circuit Bp.

Also, in a case where while an image is not displayed on the first substrate 31 side, an image is displayed on the second substrate 32 side, since the driving circuit 20 sets the value of the first power supply potential VDDT which is supplied to the first electric supply line 15, to be a value where the voltage between the first pixel electrode 61 and the opposite electrode 90 of the first light-emitting element E1 (the voltage between both ends of the first light-emitting element E1) falls below the light-emitting threshold voltage Vth_el1, an electric current does not flow in the first light-emitting element E1. Therefore, it is possible to reliably make the first substrate 31 side be in a non-luminescent state and also power consumption can be reduced compared to an aspect in which a power supply voltage which exceeds the light-emitting threshold voltage of each of the first light-emitting element E1 and the second light-emitting element E2 is supplied in common to the first circuit Tp and the second circuit Bp. That is, according to this embodiment, there is an advantage that in a light emitting device which selectively allows either one of the first substrate 31 side or the second substrate 32 side to emit light, it is possible to reduce power consumption while reliably making a face of the side which should be made to not emit light be in a non-luminescent state.

B. MODIFIED EXAMPLES

The invention is not limited to the above-described embodiment and, for example, the following modifications can be made. Also, two or more of modified examples among modified examples which are described below can also be combined.

1. MODIFIED EXAMPLE 1

The conductivity types of various transistors which are included in each pixel circuit P are optional. In the above-described embodiment, all the various transistors which are included in each pixel circuit P are composed of a P-channel type transistor. However, it is not limited thereto, and for example, all the various transistors which are included in each pixel circuit P may be N-channel type. Also, for example, some transistors of various transistors which are included in each pixel circuit P may be configured to be a P-channel type and the other transistors may be configured to be an N-channel type.

2. MODIFIED EXAMPLE 2

Figure 14:
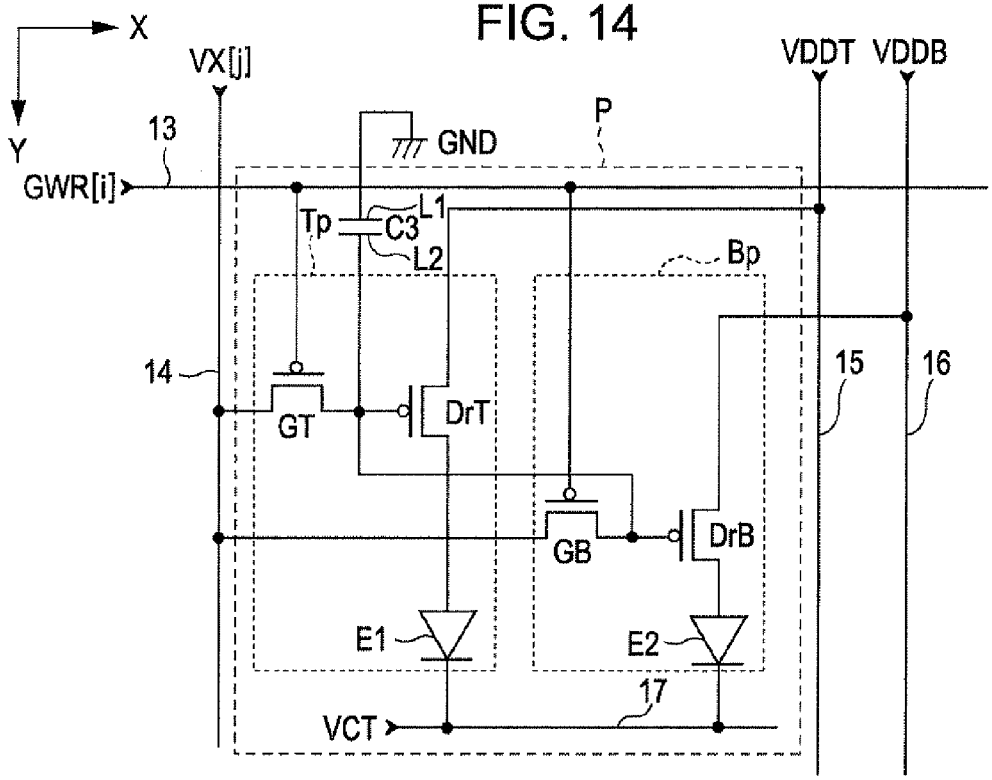
FIG. 14 is a circuit diagram of a pixel circuit related to a modified example of the invention.

As shown in FIG. 14, an aspect is also acceptable in which the first circuit Tp and the second circuit Bp share one scanning line 13 and also the first circuit Tp and the second circuit Bp share one capacitive element C3. In FIG. 14, the pixel circuit P of the j-th column of the i-th row is illustrated. As shown in FIG. 14, each of the gate of the first switching element GT and the gate of the second switching element is connected in common to the scanning line 13 of the i-th row. A scanning signal GWR[i] is supplied to the scanning line 13 of the i-th row and the on/off state of the first switching element GT and the second switching element GB is controlled in accordance with the scanning signal GWR[i]. In this aspect, the control circuit 25 does not include the above-described signal selection circuit 30. Also, as shown in FIG. 14, the capacitive element C3 includes a first electrode L1 to which a given potential GND is supplied, and a second electrode L2 which is connected to the gate of the first driving transistor DrT and the gate of the second driving transistor DrB.

In the aspect of FIG. 14, if the scanning line 13 of the i-th row is selected (if the scanning signal GWR[i] is set to be a low level), both the first switching element GT and the second switching element GB simultaneously be in an ON state and the potential of the gate of each of the first driving transistor DrT and the second driving transistor DrB is set to be the data potential VX[j] which is supplied to the data line 14 of the j-th column. Here, in a case where while an image is displayed on a face of the first substrate 31 side of the panel, an image is not displayed on a face of the second substrate 32 side, since the driving circuit 20 sets the value of the first power supply potential VDDT which is output to the first electric supply line 15, to be a high level potential VDD and on the other hand, sets the value of the second power supply potential VDDB which is output to the second electric supply line 16, to be a low level potential VSS, similarly to the above-described embodiment, an electric current according to the data potential VX[j] flows in the first light-emitting element E1, so that the first light-emitting element becomes a luminescent state and on the other hand, an electric current does not flow in the second light-emitting element E2, so that the second light-emitting element becomes a non-luminescent state.

Also, in a case where while an image is displayed on a face of the second substrate 32 side of the panel, an image is not displayed on a face of the first substrate 31 side, since the driving circuit 20 sets the value of the first power supply potential VDDT which is output to the first electric supply line 15, to be a low level potential VSS and on the other hand, sets the value of the second power supply potential VDDB which is output to the second electric supply line 16, to be a high level potential VDD, similarly to the above-described embodiment, an electric current according to the data potential VX[j] flows in the second light-emitting element E2, so that the second light-emitting element become a luminescent state and on the other hand, an electric current does not flow in the first light-emitting element E1, so that the first light-emitting element becomes a non-luminescent state. That is, also in this aspect, an advantage that it is possible to reduce power consumption while reliably making a face of the side which should be made to not emit light be in a non-luminescent state can be obtained.

3. MODIFIED EXAMPLE 3

The light-emitting element E (E1 and E2) may be an OLED element or may also be an inorganic light-emitting diode or an LED (Light Emitting Diode). In short, all elements which emit light in accordance with supply of electrical energy (application of an electric field or supply of an electric current) can be used as the light-emitting element in the invention.

C. APPLICATION

Figure 15:
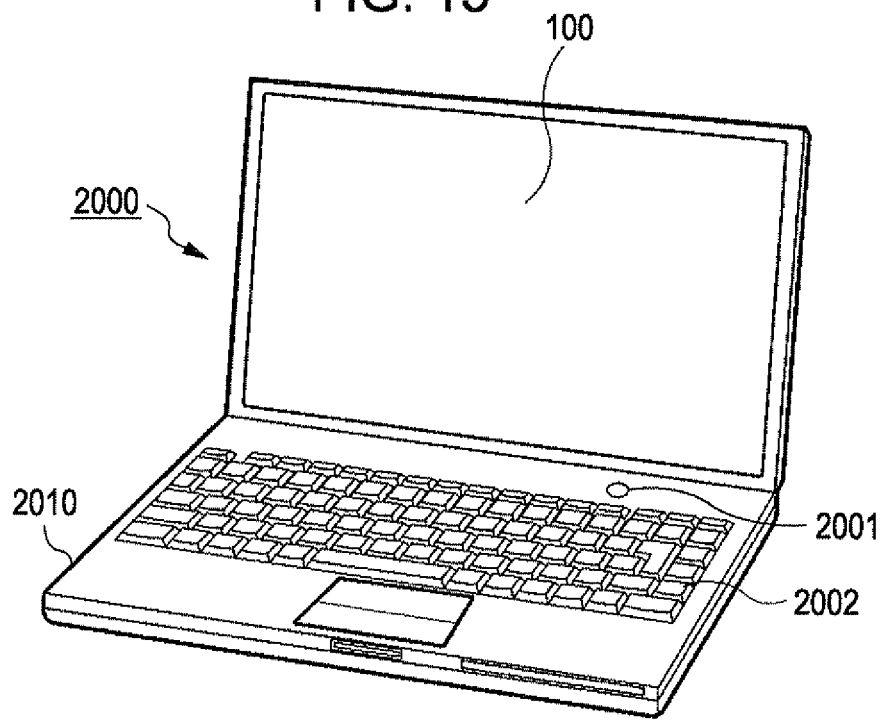
FIG. 15 is a perspective view showing a specific form of an electronic apparatus related to the invention.

Next, electronic apparatuses using the light emitting device related to the invention will be described. FIG. 15 is a perspective view showing the configuration of a mobile personal computer adopting the light emitting device 100 related to the above-described embodiment as a display device. A personal computer 2000 includes the light emitting device 100 as a display device and a main body section 2010. At the main body section 2010, a power supply switch 2001 and a keyboard 2002 are provided. Since the light emitting device 100 uses an OLEO element for the light-emitting element E, a picture having a wide viewing angle and excellent visibility can be displayed.

Figure 16:
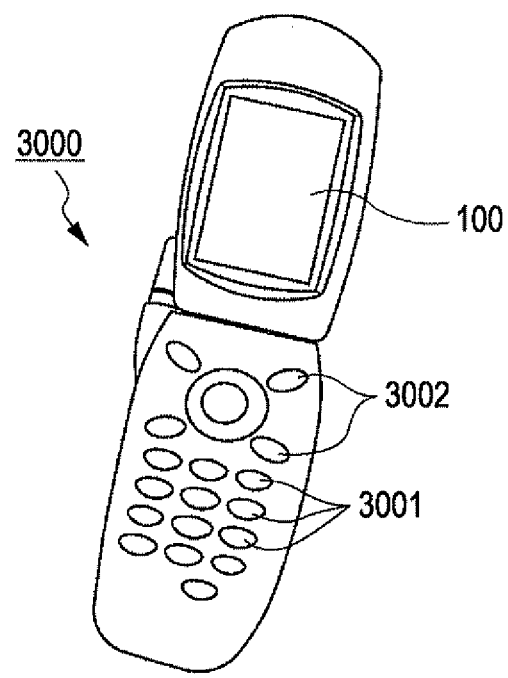
FIG. 16 is a perspective view showing a specific form of an electronic apparatus related to the invention.

In FIG. 16, the configuration of a mobile telephone adopting the light emitting device 100 related to the above-described embodiment as a display device is shown. A mobile telephone 3000 includes a plurality of operation buttons 3001 and scroll buttons 3002, and the light emitting device 100. A picture which is displayed on the light emitting device 100 is scrolled by operating the scroll button 3002.

Figure 17:
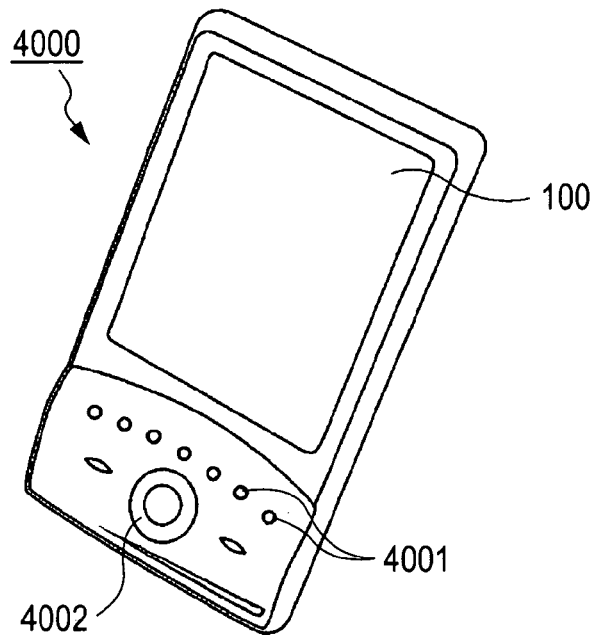
FIG. 17 is a perspective view showing a specific form of an electronic apparatus related to the invention.
Figure 18:
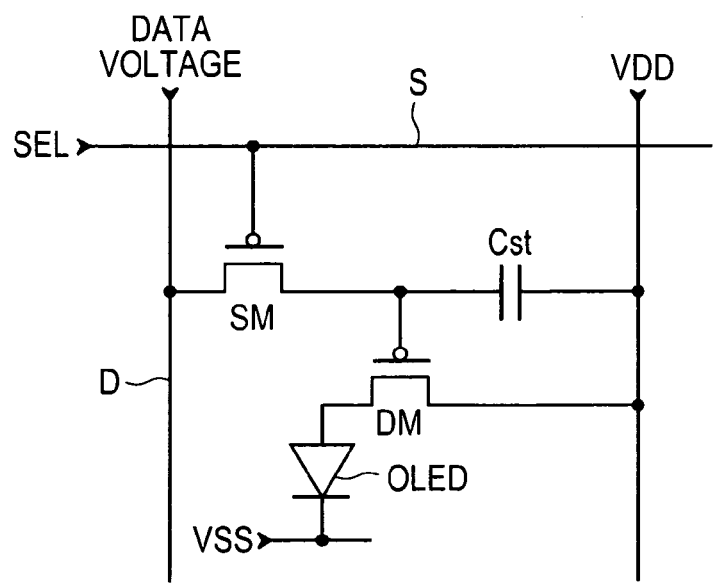
FIG. 18 is a diagram showing the configuration of a pixel circuit in an existing light emitting device.

In FIG. 17, the configuration of a portable information terminal (PDA: Personal Digital Assistant) adopting the light emitting device 100 related to the above-described embodiment as a display device is shown. A portable information terminal 4000 includes a plurality of operation buttons 4001, a power supply switch 4002, and the light emitting device 100. If the power supply switch 4002 is operated, a variety of information such as an address list or a schedule book is displayed on the light emitting device 10.

In addition, as an electronic apparatus to which the light emitting device related to the invention is applied, besides the apparatuses shown in FIGS. 15 to 17, a digital still camera, a television, a video camera, a car navigation device, a pager, an electronic notebook, electronic paper, a desktop electronic calculator, a word processor, a workstation, a television telephone, a POS terminal, a printer, a scanner, a copying machine, a video player, an equipment with a touch panel, and the like can be given.

The entire disclosure of Japanese Patent Application No.2010-86763, filed Apr. 5,2010 is expressly incorporated by reference herein.

What is claimed is:

1. A light emitting device comprising:
   a pixel circuit disposed on a substrate; and
   a driving circuit which drives the pixel circuit,
   wherein
      the pixel circuit includes
         a first circuit provided corresponding to a first electric supply line, and
         a second circuit provided corresponding to a second electric supply line,
      the first circuit includes a first light-emitting element which includes a first electrode and a second electrode which faces the first electrode, a first driving transistor having a first end electrically connected to the first electrode and a second end electrically connected to the first electric supply line, a first capacitive element for holding the potential of a first gate of the first driving transistor, and a first switching element which is provided between the first gate of the first driving transistor and a data line, wherein emitted light of the first light-emitting element is extracted from a counter direction with the substrate,
      the second circuit includes a second light-emitting element which includes a third electrode and the second electrode which faces the third electrode, a second driving transistor having a third end electrically connected to the third electrode and a fourth end electrically connected to the second electric supply line, a second capacitive element for holding the potential of a second gate of the second driving transistor, and a second switching element which is provided between the second gate of the second driving transistor and the data line, wherein emitted light of the second light-emitting element is extracted through the substrate, and
      in a case where while an image is displayed on a counter direction as the substrate by the first circuit, an image is not displayed through the substrate,
         the driving circuit outputs a data potential according to image data to the data line, sets the potential of the first electric supply line to be a value where voltage between the first electrode and the second electrode of the first light-emitting element exceeds the light-emitting threshold voltage of the first light-emitting element, and sets the potential of the second electric supply line to be a value where voltage between the third electrode and the second electrode of the second light-emitting element falls below the light-emitting threshold voltage of the second light-emitting element, and in a case where while an image is not displayed on the counter direction as the substrate, an image is displayed through the substrate by the second circuit, the driving circuit outputs the data potential to the data line, sets the potential of the first electric supply line to be a value where voltage between the first electrode and the second electrode of the first light-emitting element falls below the light-emitting threshold voltage of the first light-emitting element, and sets the potential of the second electric supply line to be a value where voltage between the third electrode and the second electrode of the second light-emitting element exceeds the light-emitting threshold voltage of the second light-emitting element.

2. The light emitting device according to claim 1, wherein the driving circuit sets the first switching element to be in an ON state and the second switching element to be in an OFF state, in a case where while an image is displayed on the counter direction as the substrate by the first circuit, an image is not displayed through the substrate, and sets the first switching element to be in an OFF state and the second switching element to be in an ON state, in a case where while an image is not displayed the counter direction as the substrate, an image is displayed through the substrate by the second circuit.

3. A light emitting device comprising:

a plurality of first scanning lines each extending in a first direction;

a plurality of second scanning lines which is provided in a one-to-one correspondence to the plurality of first scanning lines;

a plurality of data lines each extending in a second direction different from the first direction;

a plurality of pixel circuits which is disposed corresponding to each intersection of the plurality of first and second scanning lines and the plurality of data lines; and a driving circuit which drives each of the pixel circuits, wherein each of the pixel circuits includes a first circuit provided corresponding to a first electric supply line, and a second circuit provided corresponding to a second electric supply line, which are disposed on a substrate, the first circuit includes a first light-emitting element which includes a first electrode and a second electrode which faces the first electrode, a first driving transistor having a first end electrically connected to the first electrode and a second end electrically connected to the first electric supply line, a first capacitive element for holding the potential of a first gate of the first driving transistor, and a first switching element which is provided between the first gate of the first driving transistor and the data line, thereby making the gate of the first driving transistor and the data line be in an electrically conductive state at the time of selection of the first scanning line, wherein emitted light of the first light-emitting element is extracted from a counter direction with the substrate, the second circuit includes a second light-emitting element which includes a third electrode and the second electrode which faces the third electrode, a second driving transistor having a third end electrically connected to the third electrode and a fourth end electrically connected to the second electric supply line, a second capacitive element for holding the potential of a second gate of the second driving transistor, and a second switching element which is provided between the second gate of the second driving transistor and the data line, thereby making the gate of the second driving transistor and the data line be in an electrically conductive state at the time of selection of the second scanning line, wherein emitted light of the second light-emitting element is extracted through the substrate, and in a case where while an image is displayed on a counter direction as the substrate by the first circuit, an image is not through the substrate, the driving circuit sequentially selects the respective first scanning lines for each selection period without selecting the respective second scanning lines, outputs a data potential according to image data to each of the data lines, sets the potential of the first electric supply line to be a value where voltage between the first electrode and the second electrode of the first light-emitting element exceeds the light-emitting threshold voltage of the first light-emitting element, and sets the potential of the second electric supply line to be a value where voltage between the third electrode and the second electrode of the second light-emitting element falls below the light-emitting threshold voltage of the second light-emitting element, and in a case where while an image is not displayed on a counter direction as the substrate, an image is displayed through the substrate by the second circuit, the driving circuit sequentially selects the respective second scanning lines for each selection period without selecting the respective first scanning lines, outputs the data potential to the data line, sets the potential of the first electric supply line to be a value where voltage between the first electrode and the second electrode of the first light-emitting element falls below the light-emitting threshold voltage of the first light-emitting element, and sets the potential of the second electric supply line to be a value where voltage between the third electrode and the second electrode of the second light-emitting element exceeds the light-emitting threshold voltage of the second light-emitting element.

4. A driving method of a light emitting device which includes a pixel circuit disposed on a substrate, and a driving circuit which drives the pixel circuit, wherein the pixel circuit includes a first circuit provided corresponding to a first electric supply line, and a second circuit provided corresponding to a second electric supply line, the first circuit includes a first light-emitting element which includes a first electrode and a second electrode which faces the first electrode, a first driving transistor having a first end electrically connected to the first electrode and a second end electrically connected to the first electric supply line, a first capacitive element for holding the potential of a first gate of the first driving transistor, and a first switching element which is provided between the first gate of the first driving transistor and a data line, wherein emitted light of the first light-emitting element is extracted from a counter direction with the substrate, and the second circuit includes a second light-emitting element which includes a third electrode the second electrode which faces the third electrode, a second driving transistor having a third end electrically connected to the third electrode and a fourth end electrically connected to the second electric supply line, a second capacitive element for holding the potential of a second gate of the second driving transistor, and a second switching element which is provided between the second gate of the second driving transistor and the data line, wherein emitted light of the second light-emitting element is extracted through the substrate, the method comprising:

in a case where while an image is displayed on a counter direction as the substrate by the first circuit, an image is not displayed through the substrate, setting the potential of the gate of the first driving transistor to be a data potential according to image data, setting the potential of the first electric supply line to be a value where voltage between the first electrode and the second electrode of the first light-emitting element exceeds the light-emitting threshold voltage of the first light-emitting element, and setting the potential of the second electric supply line to be a value where voltage between the third electrode and the second electrode of the second light-emitting element falls below the light-emitting threshold voltage of the second light-emitting element, and in a case where while an image is not displayed on a counter direction as the substrate, an image is displayed through the substrate by the second circuit, outputting the data potential to a data line, setting the potential of the first electric supply line to be a value where voltage between the first electrode and the second electrode of the first light-emitting element falls below the light-emitting threshold voltage of the first light-emitting element, and setting the potential of the second electric supply line to be a value where voltage between the third electrode and the second electrode of the second light-emitting element exceeds the light-emitting threshold voltage of the second light-emitting element.

\* \* \* \* \*